(12) United States Patent
Schuster et al.

(10) Patent No.: US 7,884,606 B2
(45) Date of Patent: Feb. 8, 2011

(54) COOLING DEVICE FOR ARRANGEMENT BETWEEN TWO GRADIENT COIL WINDINGS OF A GRADIENT COIL

(75) Inventors: Johann Schuster, Oberasbach (DE);
Lothar Schoen, Neunkirchen (DE);
Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 339 days.

(21) Appl. No.: 12/037,213

(22) Filed: Feb. 26, 2008

(65) Prior Publication Data

US 2008/0204179 A1     Aug. 28, 2008

(30) Foreign Application Priority Data

Feb. 26, 2007    (DE)   ......................... 10 2007 009 204

(51) Int. Cl.
*G01V 3/00*      (2006.01)
(52) U.S. Cl. ........................................ 324/318; 324/307
(58) Field of Classification Search ......... 324/300–322;
600/407–435; 165/170; 336/57; 29/890.39
See application file for complete search history.

(56) References Cited

U.S. PATENT DOCUMENTS

| | | | | |
|---|---|---|---|---|
| 6,111,412 A | | 8/2000 | Broemmel et al. .......... 324/318 |
| 6,208,141 B1 * | 3/2001 | Amor et al. ................. 324/318 |
| 6,552,545 B2 * | 4/2003 | Kaindl et al. ............... 324/318 |
| 6,653,835 B2 * | 11/2003 | Roeckelein et al. ......... 324/315 |
| 7,339,376 B2 * | 3/2008 | Liu ............................. 324/318 |
| 7,463,029 B2 * | 12/2008 | Schuster et al. ............. 324/318 |
| 7,554,326 B2 * | 6/2009 | Sakakura .................... 324/318 |
| 2001/0042385 A1 * | 11/2001 | Kaindl et al. ................. 62/436 |
| 2002/0079893 A1 * | 6/2002 | Roeckelein et al. ......... 324/315 |
| 2007/0247156 A1 | 10/2007 | Schuster et al. ............. 324/318 |
| 2007/0268021 A1 * | 11/2007 | Sakakura .................... 324/318 |
| 2008/0204179 A1 * | 8/2008 | Schuster et al. ............... 336/57 |

* cited by examiner

*Primary Examiner*—Melissa J Koval
*Assistant Examiner*—Tiffany A Fetzner
(74) *Attorney, Agent, or Firm*—Schiff Hardin LLP

(57) ABSTRACT

In a cooling device for arrangement between two gradient coil windings of a gradient coil for dissipation of the heat (arising upon feeding current to the gradient coil windings) by means of a coolant flowing through one or more coolant channels in the cooling device, two films made of thermoplastic material are connected with one another, and are preformed in a thermal reshaping procedure to form coolant channel sections that are complementary to one another to form an inherently stable coolant channel after the connection.

23 Claims, 2 Drawing Sheets

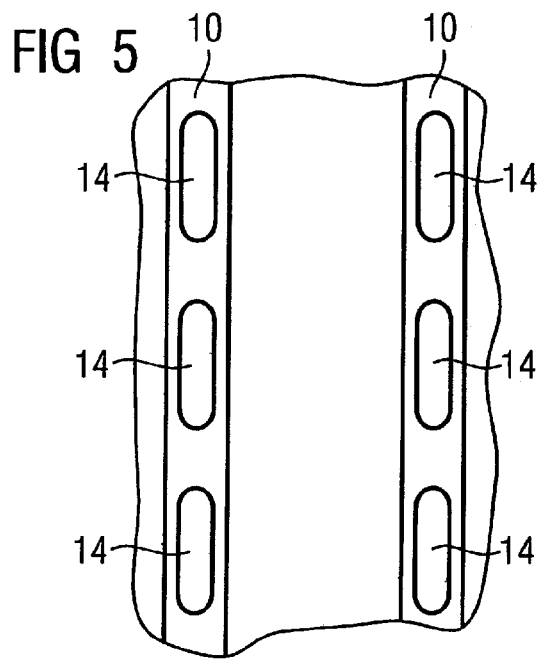
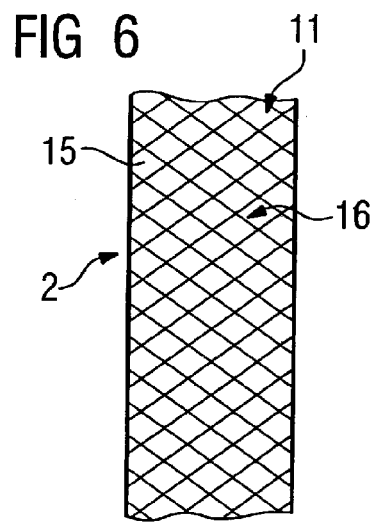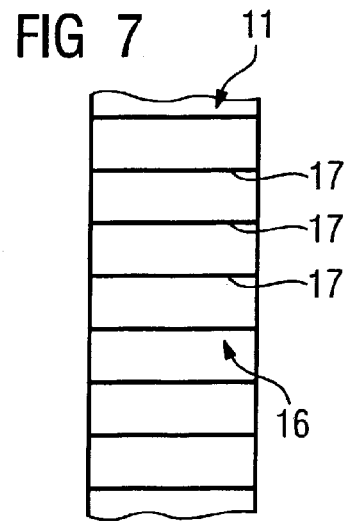
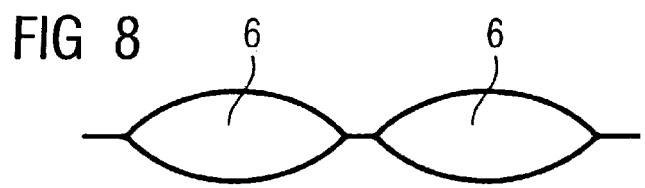

COOLING DEVICE FOR ARRANGEMENT BETWEEN TWO GRADIENT COIL WINDINGS OF A GRADIENT COIL

BACKGROUND OF THE INVENTION

1. Field of the Invention

The invention concerns a cooling device for arrangement between two gradient coil windings of a gradient coil for dissipation of the heat (arising upon current being fed to the gradient coil windings) by means of a coolant flowing through one or more coolant channels in the cooling device.

2. Description of the Prior Art

Gradient coils have in a known manner, a number of conductor structures cast in a resin matrix (for the most part epoxy resin) that are fed with current to generate spatially-resolved three-axis magnetic fields. Gradient currents of several hundred amperes at voltages of up to 2 kV are typical and lead to power losses of 10 kW and more, and must be dissipated in the form of heat. Cooling devices are therefore cast in the coil that are embedded between the individual coil supports in order to be able to discharge the dissipated power as effectively as possible. The thermal resistance between the heat sources (thus the gradient coil windings) and the heat sinks (thus the coolant medium) should be optimally slight, which is why the distance from the cooling devices to the coil conductors should be as small as possible given an optimally large heat exchanger area.

A known cooling device has a thin supporting plate on which meandering cooling tubes with round cross-section are wound. The cooling tubes, of which several hundred meters are typically required in a number of parallel cooling circuits per coil, must be manually conducted through bores in the support plate and fixed until knotted waxed silk cords. The cooling tubes are laid such that the tube ends for the water inlet and outlet are placed directly next to one another, and are set at the corresponding connection parts after encasing of the entire gradient coil.

The manual connection of the cooling tubes with the support plate is very complicated and time-consuming and thus expensive. Moreover, due to the round tube cross-section only a linear contact to the heat-generating copper conductor winding (with correspondingly poor heat transfer) results.

SUMMARY OF THE INVENTION

An object of the invention is to provide a cooling device that can be produced in a simple manner and with which a good cooling capacity can be achieved.

This object is achieved in accordance with the invention by a cooling device of the aforementioned type wherein two films are connected with one another (which films are made of a thermoplastic material) that are preformed in a thermal reshaping procedure to fashion coolant channel sections that are complementary to one another to form an inherently stable coolant channel after the connection.

The invention allows the simple and cost-effective production of large-surface cooling devices. Only two larger-surface, preformed structural elements are required in the form of two plastic films made of thermoplastic material. These are locally or globally heated in a thermal reshaping procedure in order to fashion channel sections, consequently to mold channel-like recesses. The two films are provided with congruent channel section geometries so that the coolant channel sections are complementary to one another when the two films are inventively placed atop one another and are connected with one another. The films made of thermoplastic material are selected with regard to their thickness (strength) or the employed material so that the coolant channel is inherently stable, meaning that it exhibits a sufficient minimum stability and does not collapse on itself.

The inventive cooling device thus can clearly be produced extremely simply because only the two films must be preformed and connected with one another, after which the installation in the gradient coil and the casting can either immediately ensue, or the connection pieces can be connected to the coolant inlets and outlets in advance.

The films themselves are preferably reshaped by deep drawing, for which a corresponding deep draw mold is required. The film is locally or globally heated and deformed by vacuum and/or overpressure corresponding to the mold geometry.

Because gradient coils typically exhibit a cylindrical cross-section, a cooling device must also be capable of being integrated into a correspondingly curved shape. A curve is possible in the inventive cooling device insofar as it is produced from flat films and is likewise flat after the foil connection. The foils or the cooling device or the coolant channel wall or walls exhibit a certain elasticity that allows a bending of the flat cooling device by, for example, 90° or 180°. In order to achieve this, a coolant channel section is provided at least in regions with at least one film with a structure that can be deformed by a bending load (bending force), particularly in the form of grooves. Such a structure (for example like an accordion) is in particular appropriate in the region of the edge-side collection channels (if such are provided) and that are to be bent around their longitudinal axis, while in the other regions the deformability of the channel walls is typically sufficient in order to be able to compensate for expansions and compressions due to bending. This structure can be generated without further measures during the thermal reshaping procedure.

As an alternative, it is possible for the cooling device to exhibit an inherently stable, defined curve shape. Films are used for which a defined curve shape was already impressed in the reshaping procedure, for example a 90° or a 180° shape. The two preformed and pre-curved films are set atop one another to overlap the channel sections and are connected with one another so that the cooling device is also curved. This embodiment requires two different shapes for the production of the outer film and the inner film.

In an embodiment of the invention, a surface structure (for example in the form of longitudinal or transverse grooves, knobs, etc.) can be provided at least in sections in the region of the inner side of the coolant channel or channels. This surface structure serves for generation of turbulences to improve the heat transfer, as well as causing the heat transfer surface to be enlarged. This surface structuring should primarily be in regions where high power losses are to be dissipated, so the pressure loss can also be minimized.

As described, an inventive cooling device is cast in the sealing compound upon assembly in a gradient coil. For a firm connection and to avoid the formation of voids and the like it is appropriate when breakthroughs in the connection region of the films are provided to enable the passage of a sealing compound used in the manufacture of a gradient coil. The sealing compound (which is poured in a liquid state) can thus flow through the (typically used) multiple cooling devices in the region of the passages without further measures, such that a complete embedding and solid connection is provided.

The thickness of the employed film should be $\leq 0.5$ mm. This ensures a sufficient inherent stability of the channel walls, and the heat transfer can be optimized since the distance between heat source (coil winding) and heat sink (coolant) is not unnecessarily increased by a film that is too thick. The films themselves should be thermally stable at least up to 120° C. to preclude any deformations or other negative effects from occurring in the casting.

The films can be thermally fused (welded) with one another. Alternatively, an adhesive for gluing the films can be used. The thermal fusing is particularly appropriate since this can ensue while still in the reshaping mold in a single step immediately following the thermal reshaping. The initial films are placed in the respective mold halves and are, for example, deep-drawn into these molds after heating in order to form the channel section structure. The two mold halves are then merely moved together, and the still-heated thermoplastic film material of the films is thermally fused at the featured connection points. These connection points naturally demarcate the coolant channels. During this processing step the possibility also simultaneously exists to fashion the breakthroughs in the region of the connection or fusing joints (that should be executed sufficiently wide). When the mold is subsequently opened, the finished cooling device can be extracted in a single production step.

A number of advantages can be achieved with the inventive cooling device. The device and the channel structure thereof are dimensionally stable; so no additional outlay for stabilization in the coil assembly and in the casting is required. Because the films can be arbitrarily deformed to shape the coolant channel sections, a very flat channel (and thus flat cooling structure) can be achieved. The channels can be made wide compared with round tubes; the cross-section of the individual cooling channel can be wide, but dimensioned flat in terms of its height. Arbitrary channel geometries can thereby be achieved. The channel geometry can also be optimally matched to the geometry of the heat sources, meaning that an optimal channel guidance is possible dependent on the winding route of the gradient coil windings. The pressure loss is less than given use of tubes since the length of the cooling channel ultimately lies only in the range of the coil length. The channel length and the coil length thus substantially correspond to one another. Furthermore, the risk of possible failure points or leaks is significantly less relative to a multi-layer glued design or a wound tube structure (in this case up to 650 m of tube are required in a gradient coil).

In addition to the cooling device itself, the invention also concerns a method for production of such a cooling device that is characterized by using two films made of a thermoplastic material and performing the films with coolant channel sections in a thermal reshaping procedure, and connecting the preformed films being complementary to one another to form, with the channel sections, an inherently stable coolant channel. The films are appropriately deep-drawn for reshaping, with both films being deep-drawn in respective mold parts of a common reshaping tool, and are connected with one another by movement of the two mold parts together (thus are thermally fused) immediately after the deep drawing.

As an alternative to the reshaping of the films immediately before the connection in the same reshaping tool, it is possible to use preformed films that are connected with one another in a procedure independent of the reshaping method. This can also ensue by thermal fusing or gluing. In principle other typical fusing methods (radio-frequency/ultrasound/laser fusing) are also possible for connection of the two deep-drawn films.

Furthermore, during the reshaping procedure at least one structure that is deformable (in particular in the shape of grooves or the like) given a bending load can be generated at least in one region of the coolant channel section, for which the mold can be appropriately formed. It is alternatively or additionally possible to use for the reshaping procedure a film already inherently provided (at least in sections) with a structure that is deformable given a bending load. In this case the film is fashioned with a groove profile, for example.

The formation of a deformable structure is required when only the channel section geometry is formed in the reshaping method, but the films are otherwise planar as before. The bending of the cooling device corresponding to the required radius ensues only after the connection, dependent on the position on the gradient coil. Alternatively, the invention allows the films to be shaped with a defined arc shape in the reshaping procedure. This means that no separate deflection subsequently ensues, rather the desired bend radius is innately impressed on the films. It is also possible to connect the two films with one another by moving the mold halves together immediately after the deep drawing; the removable cooling device is then a body innately curved by, for example, 90° or 180°.

Furthermore, in the reshaping procedure it is possible to generate a surface structure at least in segments at least in the region of the inner side of the coolant channel section or sections, or to use a film innately possessing such a surface structure for the reshaping method. This surface structure serves for generation of current turbulences in the channel in order to improve the heat transfer. For example, a knob profile or a surface roughening is conceivable for this purpose. This profile can be formed either in the reshaping procedure (thus by corresponding shaping with the reshaping tools) or alternatively a film that is innately profiled can be used.

Breakthroughs to enable a passage of a sealing compound used in the production of a gradient coil can also be generated in the region of the connection sections directly upon reshaping or upon or after the connection of the films.

The employed films themselves should exhibit a thickness $\leq 0.5$ mm given a thermal stability of at least 120° C.

BRIEF DESCRIPTION OF THE DRAWINGS

FIG. 5 is a plan view of a portion of a further embodiment of an inventive cooling device.
FIG. 6 shows the inside of a coolant channel with a surface structure of a first embodiment.
FIG. 7 is a view corresponding to FIG. 6 with a surface structure of a second embodiment.
FIG. 8 shows a further channel shape embodiment in cross-section.

DESCRIPTION OF THE PREFERRED EMBODIMENTS

Figure 1:
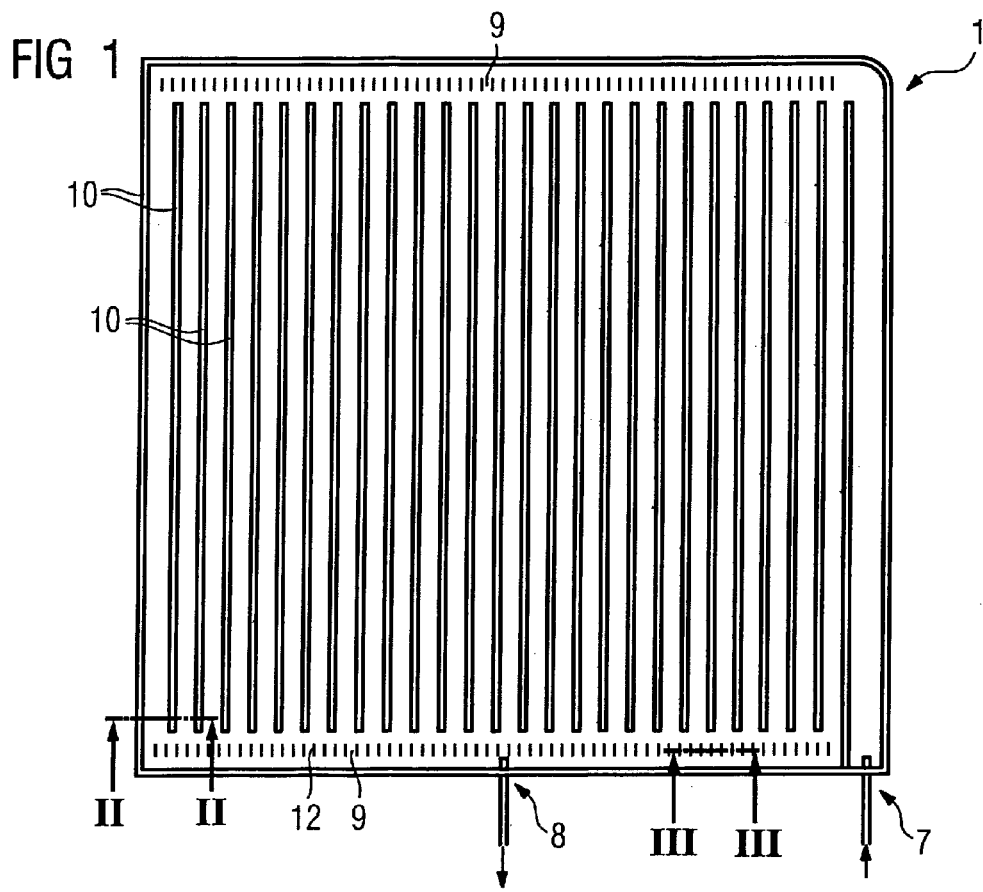
FIG. 1 is a plan view of an inventive cooling device.

FIG. 1 shows an inventive flat cooling device 1 having (see FIG. 2) two separate films 2, 3, both comprising a thermoplastic plastic material, which films were reshaped in a reshaping method to form a specific channel geometry. Each film has been provided with coolant channel sections 4, 5 (running vertically in the shown example) in a deep drawing method, whereby the coolant channel sections 4, 5 connect to form a dimensionally-stable coolant channel 6 after the films 2, 3 are placed atop one another. This coolant channel 6 runs effectively in a meandering path from the inlet 7 to the outlet 8. Respective collection channel sections 9 (that are not shown in detail in section) are formed at the facing sides. The two films 2, 3 are connected liquid-tight with one another in the region of the connection sections 10 in a thermal connection method. This appropriately ensues directly in the reshaping tool that has two mold parts in which the films 2, 3 can respectively be placed and deep-drawn. The two mold parts are then moved together, causing the two films 2, 3 to be fused with one another by the application of pressure in the region of the connection sections 10. The finished cooling structure can then be removed from the mold.

Figure 2:
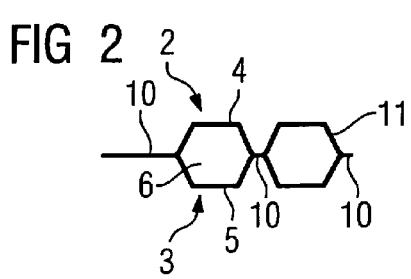
FIG. 2 is a section view along the line II-II in FIG. 1.

As FIG. 2 shows, in an exemplary embodiment, the channel sections 4, 5 being polygonal, such that overall a hexagonal shape of the coolant channel results. The cooling device 1 is typically curved (for example by 90° or 180°) for installation in the structure of a gradient coil. The walls 11 of the coolant channels 6 are thereby stressed to bend. The outer walls 11 are thereby distended somewhat, the inner walls are somewhat compressed. The film, which exhibits a thickness of less than 0.5 mm, is sufficiently elastic so that the respective distension or compression can be accommodated without further measures.

Figure 3:
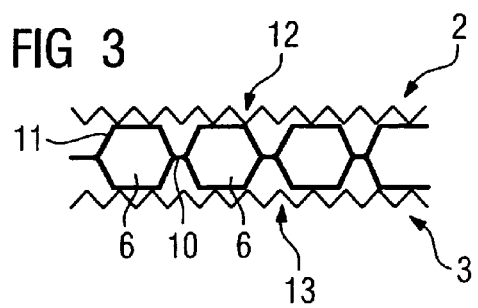
FIG. 3 is a section view along the line III-III in FIG. 1.
Figure 4:
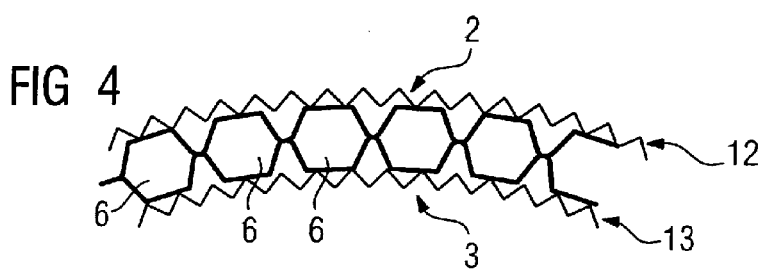
FIG. 4 shows the view of FIG. 3 in a slightly curved state.

A corresponding deformable structure 12, 13 is appropriately provided in the region of both films 2, 3 (in the manner of an accordion structure here in the shown example; see FIGS. 3 and 4) only in the region of the collection channels 9. This structure also allows without further measures a bending of these collection channels 9 running transverse to the bend axis (see FIG. 4). The structure 12 there has been arrived at due to distension while the structure 13 was compressed. For clarity the channel walls 11 are also shown as well as the connection sections 10. The upper channel walls 11 of the film 2 of two adjacent cooling channels 6 are clearly drawn apart from one another while the upper channel walls 11 migrate closer to one another. It would naturally be possible to also provide such a structure (then running in the same direction) at the channel walls 11, but this is not absolutely necessary due to the inherent elasticity of the film material and the deformability of the structure.

Furthermore, as shown in partial view in FIG. 5, breakthroughs 14, through which a sealing material can flow in the production of the gradient coil, are then preferably fashioned wider in the region of the connection sections 10 than is shown in FIG. 2. These breakthroughs 14 can be of any geometry as long as they enable material therethrough. They can likewise be punched (knocked) out upon movement of the mold parts together in the preferred single production step, for which the mold parts are correspondingly profiled.

FIGS. 6 and 7 show an inner view of a coolant channel 6 with view of the inside, for example of the upper cooling wall 11 of the film 2. The inside 15 of this channel wall 11 is provided with a surface structure 16 (here, for example, in the form of intersecting grooves). With this surface structure it is possible to generate turbulent flow, which is conducive to the improvement of heat transfer from the gradient coils to the coolant (for example water). Instead of the corrugation-like surface structure 16 according to FIG. 4, grooves 17 directed inwardly can also be used as a surface structure 16 as well as knobs (not shown in detail here) or the like; the geometry can ultimately be arbitrary. This surface structure 16 is respectively directed inwards towards the inside of the channel. For example, this also enables films 2, 3 innately occupied with the surface structure 16 (preferably over the entire surface) to be used. The surface structure would in this case be provided in all channel sections, for example. A connection of the structured films 2, 3 is possible without further measures in spite of surface structuring because the thermoplastic material heats in the mold parts and is consequently softened, such that by pressure application the surface structures disappear in the connection and a film fusing over the entire surface results. The corresponding surface structure 16 can naturally be provided on both channel walls, thus on both films 2, 3.

FIG. 8 shows a principle representation of a further geometry of a coolant channel 6. This is executed rounded on both sides so that an essentially oval cross-section shape results. Because the channel sections worked from the films via deep drawing (thus thermal reshaping) as described, any arbitrary channel geometry can clearly be realized; the corresponding shaping tool is merely to be correspondingly fashioned. This allows it to be optimally adapted to the conditions with regard to the gradient coil windings; consequently the channels also run only where the coil conductors (and consequently the heat sources) are also present. Due to the reshaping, arbitrary channel cross-sections can also be realized, which is different than given the use of cooling tubes exhibiting only a round channel cross-section.

The employed films can be formed, for example, of polycarbonate but any other thermoplastic that can be deep-drawn in a simple manner and that has a thermal stability of at least 120° C. (which is required in order to withstand the maximum temperature prevalent in the casting) can be used.

Although modifications and changes may be suggested by those skilled in the art, it is the intention of the inventors to embody within the patent warranted hereon all changes and modifications as reasonably and properly come within the scope of their contribution to the art.

We claim as our invention:

1. A cooling device configured for cooling a gradient coil, said cooling device comprising:
    two films configured for placement between two gradient windings of a gradient coil, said gradient coil windings producing heat during operation thereof;
    each of said films being comprised of thermoplastic material; and
    said two films being connected to each other and preformed by a thermo reshaping procedure in order to form respective portions of coolant channels within said films, said portions being complementary to each other and forming an inherently stable coolant channel upon connection of said two films with each other, said coolant channel being configured to have a coolant flowing therein in order to dissipate said heat from said gradient coil windings.

2. A cooling device as claimed in claim 1 wherein said two films are deep-drawn in order to form said coolant channel portions respectively therein.

3. A cooling device as claimed in claim 1 wherein each of said two films comprises a film structure in said coolant channel portion thereof that is deformable upon application of a bending load thereto.

4. A cooling device as claimed in claim 3 wherein said film structure is a plurality of grooves.

5. A cooling device as claimed in claim 1 wherein said two films have an inherently stable predetermined curve shape.

6. A cooling device as claimed in claim 1 wherein each of said two films comprises
    a surface structure located in the respective coolant channel portion thereof, said surface structure, when said two films are connected, being located in an interior of the formed coolant channel.

7. A cooling device as claimed in claim 1 wherein said two films are connected with each other in a connection region, said connection regions comprising breakthroughs that enable passage of a sealing compound therethrough in order to produce a gradient coil from said gradient coil windings of said cooling device.

8. A cooling device as claimed in claim 1 wherein each of said two films has a thickness that is less than or equal to 0.5 mm.

9. A cooling device as claimed in claim 1 wherein said thermoplastic material is thermally stable up to at least 120° C.

10. A cooling device as claimed in claim 1 wherein said two films are connected to each other by a connection selected from the group consisting of thermally fused connections and glued connections.

11. A method for producing a gradient coil cooling device comprising the steps of:
configuring two films, each made of a thermoplastic material, for placement between two gradient coil windings that generate heat during operation thereof;
pre-shaping said two films in order to form coolant channel portions respectively within said films in a thermo reshaping procedure, said coolant channel portions being complementary to each other; and
connecting said two films with each other in order to form an inherently stable coolant channel from the complementary coolant channel portions in the respective films, said coolant channel being configured to have a coolant flow therein in order to dissipate said heat generated by said gradient coil windings.

12. A method as claimed in claim 11 comprising deep-drawing said two films in said thermal re-shaping procedure.

13. A method as claimed in claim 12 comprising:
deep-drawing said respective films in respective molds in a common reshaping tool, and
connecting said two films with each other by movement of said mold parts together after deep-drawing said two films.

14. A method as claimed in claim 11 comprising connecting said two films with each other in a procedure that is separate and independent from said thermal re-shaping procedure.

15. A method as claimed in claim 14 comprising connecting said films with each other by forming a connection selected from the group consisting of thermally fused connections and glued connections.

16. A method as claimed in claim 11 comprising, in said reshaping procedure, providing each film with a structure, in the respective coolant channel portion thereof, that is deformable upon application of a bending load.

17. A method as claimed in claim 11 comprising employing, as said two films, two films that are provided with a structure that is deformable upon application of a bending load thereto, prior to implementing said reshaping procedure, in respective regions of the two films that will then form said coolant channel portions in said reshaping procedure.

18. A method as claimed in claim 11 comprising, in said reshaping procedure, providing said two films with a predetermined curved shape.

19. A method as claimed in claim 11 comprising, in said reshaping procedure, providing a surface structure on said two films that, when said two films are connected, is located in an interior of said coolant channel.

20. A method as claimed in claim 11 comprising connecting said two films with each other in a connection region, and comprising, in said connection region, providing breakthroughs that allow passage of a sealing compound therethrough.

21. A method as claimed in claim 11 comprising employing, as said two films, respective films having a thickness of less than or equal to 0.5 mm.

22. A method as claimed in claim 11 comprising employing, as said two films, two films formed of a thermoplastic material that is stable up to at least 120° C.

23. A gradient coil comprising:
two gradient coil windings that produce heat during operation thereof;
a cooling device comprising two films configured for placement between said gradient coil windings, said two films being comprised of thermoplastic material that has been pre-formed in a thermal reshaping procedure in order to form respective coolant channel portions within the films that are complementary to each other and said two films being connected to each other in order to form an inherently stable coolant channel from said complementary coolant channel portions, said coolant channel being configured to have coolant flowing therein in order to dissipate said heat generated by said gradient coil windings; and
a cured sealing compound encompassing said gradient coil windings and said cooling device.

* * * * *